United States Patent
Gonzalez Inda et al.

(10) Patent No.: US 11,647,609 B2
(45) Date of Patent: May 9, 2023

(54) MULTISIDED HEAT SPREADER

(71) Applicant: ARRIS Enterprises LLC, Suwanee, GA (US)

(72) Inventors: Carlos Paul Gonzalez Inda, Guadalupe (MX); Luis Carlos Lopez Moreno, Apodaca (MX); Oswaldo Enrique Linares Rivas, Guadalupe (MX); Hector Jose Hevia, Apodaca (MX); Julio Cesar Ayala Vera, Apodaca (MX)

(73) Assignee: ARRIS ENTERPRISES LLC, Suwanee, GA (US)

( * ) Notice: Subject to any disclaimer, the term of this patent is extended or adjusted under 35 U.S.C. 154(b) by 99 days.

(21) Appl. No.: 17/407,624

(22) Filed: Aug. 20, 2021

(65) Prior Publication Data
US 2022/0192055 A1 Jun. 16, 2022

Related U.S. Application Data (60) Provisional application No. 63/125,520, filed on Dec. 15, 2020.

(51) Int. Cl.
H05K 7/20 (2006.01)
H04R 1/02 (2006.01)
H05K 1/02 (2006.01)

(52) U.S. Cl.
CPC ......... *H05K 7/20509* (2013.01); *H04R 1/025* (2013.01); *H05K 1/0203* (2013.01)

(58) Field of Classification Search
CPC ........... H05K 7/20409; H05K 7/20418; H05K 1/0203; H05K 7/20509; H05K 7/2039;
(Continued)

(56) References Cited

U.S. PATENT DOCUMENTS 6,205,025 B1 3/2001 Chen
9,485,852 B2 * 11/2016 Gutermuth ........... H05K 1/0201
(Continued)

FOREIGN PATENT DOCUMENTS

GB 2 431 776 5/2007

OTHER PUBLICATIONS

International Search Report and the Written Opinion of the International Searching Authority dated Jan. 3, 2022 in International (PCT) Application No. PCT/US2021/046826.

*Primary Examiner* — Adam B Dravininkas
(74) *Attorney, Agent, or Firm* — Wenderoth, Lind & Ponack, L.L.P.

(57) ABSTRACT

A multisided heat spreader includes a base, a first wall, and a second wall. A proximal end of the first wall is connected to a first end of the base. A proximal end of the second wall is connected to a second end of the base which is opposite to the first end of the base. A space is defined adjacent to a first surface of the base and between the first wall and the second wall such that the multisided heat spreader is open between a distal end of the first wall and a distal end of the second wall. The first wall and the second wall are configured to receive an electronic component in the space therebetween. A second surface of the base is configured to be attached to a heat generation component. The first surface of the base is opposite to the second surface of the base.

20 Claims, 6 Drawing Sheets

(58) Field of Classification Search
CPC ............. H05K 7/20445; H05K 3/0061; H05K 2201/066; H04R 1/025
See application file for complete search history.

(56) References Cited

U.S. PATENT DOCUMENTS

| | | | |
|---|---|---|---|
| 9,694,451 B1* | 7/2017 | Ross | H05K 7/20145 |
| 2002/0131238 A1* | 9/2002 | Fisher | H01L 23/3672 |
| | | | 257/E23.083 |
| 2006/0181858 A1* | 8/2006 | Kamemoto | H01L 23/552 |
| | | | 257/E23.09 |
| 2006/0187643 A1* | 8/2006 | Tsurufusa | H05K 7/2049 |
| | | | 361/704 |
| 2011/0205710 A1* | 8/2011 | Kondo | H05K 7/20436 |
| | | | 361/714 |
| 2012/0243176 A1* | 9/2012 | Ritter | H05K 7/20445 |
| | | | 361/692 |
| 2013/0063895 A1* | 3/2013 | Ritter | H01L 23/3677 |
| | | | 361/692 |
| 2013/0347051 A1* | 12/2013 | Bose | H04N 21/418 |
| | | | 725/151 |
| 2014/0321064 A1* | 10/2014 | Bose | H05K 7/2039 |
| | | | 361/720 |
| 2017/0181265 A1* | 6/2017 | Hunt | H05K 1/0216 |
| 2017/0181266 A1* | 6/2017 | Hunt | H05K 9/0032 |
| 2020/0060049 A1 | 2/2020 | Adam et al. | |

* cited by examiner

| Ambient Temperature 40C | | Temperature in Celsius | | | | |
|---|---|---|---|---|---|---|
| Device | Designator | Max Allowed Temperature | | | Traditional Heat Plate | Multisided Heat Spreader |
| | | Junction | Case | Ambient | | |
| Mainboard | | | | | | |
| SoC | U5000 | 125 | | | 95.4 | 83.4 |
| PMIC | U400 | 125 | | | 91.2 | 81.9 |
| LPDDR4 | U5700 | | 85 | | 94.4 | 84.8 |
| eMMC | U5600 | | 85 | | 87.4 | 77.8 |
| Ethernet | U8401 | | | 85 | 88.5 | 79.4 |
| FEM DFN | U6001 | | 85 | | 90.3 | 80.8 |
| FEM DFN | U6003 | | 85 | | 90.1 | 80.7 |
| Amplifier Board | | | | | | |
| Amplifier 1 | U2100 | 135 | | (85) | 116.7 | 109.0 |
| Amplifier 2 | U2101 | 150 | | | 145.6 | 134.3 |
| Mic Board | | | | | | |
| Mic | U9200 | | | 85 | 61.0 | 60.8 |
| Mic | U9201 | | | 85 | 61.0 | 60.8 |
| Mic | U9202 | | | 85 | 62.4 | 61.7 |
| Mic | U9303 | | | 85 | 62.4 | 61.8 |
| Enclosure | | | | | | |
| Enclosure Top : Max Temperature | | | 65 | | 54.8 | 54.4 |
| Enclosure Bottom : Max Temperature | | | 65 | | 70.1 | 64.9 |
| Enclosure Front: Max Temperature | | | 65 | | 58.8 | 55.3 |
| Enclosure Rear: Max Temperature | | | 65 | | 65.5 | 61.4 |
| Enclosure Right: Max Temperature | | | 65 | | 61.4 | 56.1 |
| Enclosure Left: Max Temperature | | | 65 | | 62.8 | 57.8 |

*FIG. 6*

MULTISIDED HEAT SPREADER

TECHNICAL FIELD

The subject matter of the present disclosure relates generally to a multisided heat spreader and a device including the multisided heat spreader.

BACKGROUND

In devices that generate heat, a heat spreader may be utilized by these devices to dissipate that heat. For example, an electronic device (e.g., a smart speaker, Smart Media Device (SMD), wireless extender, cable modem, gateway device, set-top box (STB), customer premise equipment (CPE) device, etc.) may have one or more heat spreaders designed to transfer heat by conduction to a wider area in order to avoid hotspots. Also, heat spreaders transfer heat to a wider area near the external surface of the product housing in order to achieve more efficient heat convection.

The device may house electronic circuits that perform various functions such as displaying or playing data such as audio/video (A/V) media content. In some instances, the device may house electronic circuits that convert electrical audio input signals into sounds for playing data such as audio media content including radio programming and podcasts. For example, the device may include a speaker box or housing, a driver and a passive radiator.

The electronic circuits may include circuit boards or panels on which interconnected circuits and other components are mounted or printed. Since components such as front end modules (FEMs) produce a substantial amount of heat, thermal management techniques are implemented for dissipation of the heat so as to protect the components from a degradation in operating performance or damage.

Electronic components are increasingly being manufactured so as to be more compact, which entails a challenge in heat dissipation for optimal performance. This contributes to the reduction of space within electronic equipment and the capacity to dissipate heat is compromised. In order to provide heat dissipation in integrated circuits (ICs), heat spreaders with different geometric configurations are used.

Existing solutions generally involve mounting a flat heat spreader on top of a circuit board, thereby allowing heat to travel away from the circuit board so as to be dispersed into cooler air. In particular, heat plates may be placed above a heat generation component to transfer heat to the external panels of the electronic equipment. Due to the complexity of the electronic equipment where these heat spreaders are used, the space is reduced (i.e., the density of the components therein is high) so it is necessary to provide an appropriate configuration for a heat spreader within the electronic equipment. In addition, in existing solutions, air flow may not be sufficient to dissipate enough heat to achieve optimum thermal performance. For example, traditional heat spreaders may create a concentration of heat at one or more undesirable locations (e.g., heat may be concentrated at a bottom of an enclosure such that the bottom of the enclosure is hotter than the rest of the enclosure). Therefore, existing solutions only use one heat transfer method and fail to optimally dissipate heat.

Thus, it would be advantageous and an improvement over existing solutions to provide a multisided heat spreader that efficiently disperses heat away from higher-temperature components using both convection and conduction heat transfer methods.

SUMMARY

A multisided heat spreader for use with a device (such as in a smart speaker or an SMD) is disclosed in the present application.

The device comprises:
a multisided heat spreader;
a heat generation component; and
an electronic component,
wherein:
the multisided heat spreader includes a base, a first wall and a second wall;
a proximal end of the first wall is connected to a first end of the base;
a proximal end of the second wall is connected to a second end of the base;
the first end of the base is opposite to the second end of the base;
a space is defined adjacent to a first surface of the base and between the first wall and the second wall such that the multisided heat spreader is open between a distal end of the first wall and a distal end of the second wall;
the first wall and the second wall are configured to receive the electronic component in the space therebetween;
a second surface of the base is configured to be attached to the heat generation component; and
the first surface of the base is opposite to the second surface of the base.

The walls of the multisided heat spreader described herein may transfer heat to circulating air (convection) and conduct heat (conduction) toward the side panels of an enclosure within which the multisided heat spreader is located. Using both heat transfer methods (convection and conduction), the thermal design of the multisided heat spreader is able to achieve required thermal performance. The multisided heat spreader spreads heat generated by a device over multiple sections (e.g., the top, front, and back panels) of an enclosure of the device.

When the components of the device are assembled, the IC is not near the surface of the enclosure that promotes the heat transfer required for optimal work. The multisided heat spreader provides contact with the IC and helps to transfer the heat to the side panels of the enclosure to provide better heat transfer with the outside of the device. The multisided heat spreader both improves heat transfer from ICs and reduces the space needed for electronic equipment. This cooling solution can be adapted to the surrounding industrial design and is suitable for a device such as a smart speaker.

The walls of the multisided heat spreader described herein can be adapted to the height of the enclosure and the free space that other components provide within the device. The multisided heat spreader removes heat to the side panels of the enclosure because of the geometry of the walls. The walls increase the contact area with the cooling fluid (air) versus a traditional heat plate located on top of a PCB.

BRIEF DESCRIPTION OF THE DRAWINGS

In the drawings, like reference numbers generally indicate identical, functionally similar, and/or structurally similar elements.

DETAILED DESCRIPTION

Exemplary embodiments will be described in detail below with reference to the drawings. The description and drawings are provided so that a person skilled in the art can fully understand the present disclosure and are not intended to limit the subject matter recited in the claims.

The multisided heat spreader and device disclosed herein use both heat transfer methods (convection and conduction) to achieve required thermal performance.

The multisided heat spreader and device disclosed herein address and solve the following problems:

How to provide maximum surface area for dissipating heat.

How to avoid trapping of heat underneath a heat spreader.

How to prevent overheating of higher-temperature components of a circuit board.

How to reduce the concentration of heat at the bottom of an enclosure of a device.

How to leverage the solution to the above-mentioned problems in a heat spreader with a minimal number of parts in a minimal amount of space.

The multisided heat spreader and device disclosed herein solve the problems identified above and provide an efficient and cost effective solution to dispersing heat away from both higher-temperature components and lower-temperature components of a circuit board.

The multisided heat spreader disclosed herein transfers heat into colder air and releases the heat away from the circuit board.

Figure 1:
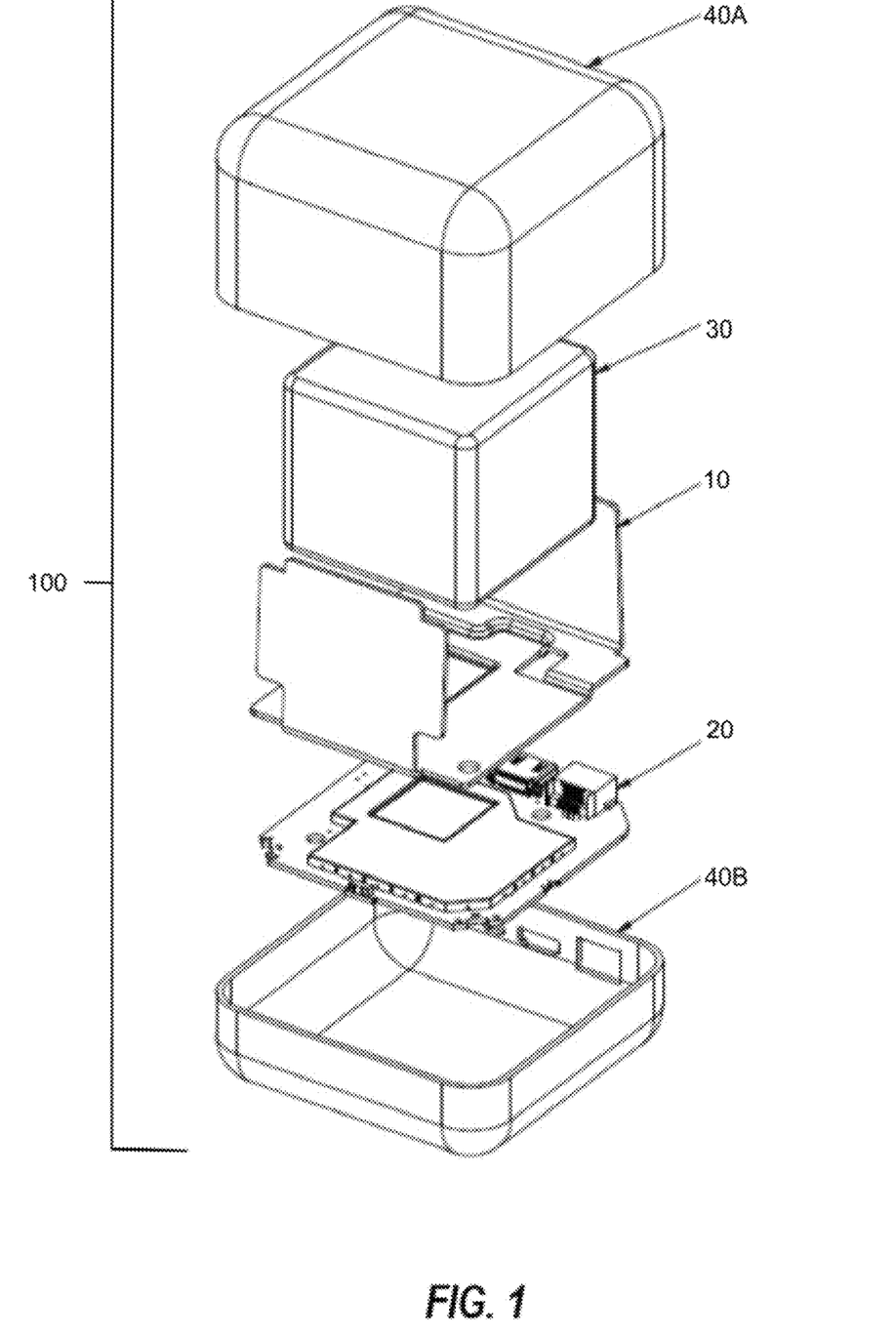
FIG. 1 shows an exploded front perspective view of an example device according to the present disclosure.

Described herein is a multisided heat spreader that may be located in a device to facilitate heat transfer through both convection and conduction. FIG. 1 shows an exploded front perspective view of an example device 100 having an enclosure comprised of a cover 40A and a chassis 40B. The device 100 may be an electronic device that generates heat. For example, the device 100 may be a smart speaker, SMD, wireless extender, cable modem, gateway device, STB, CPE device, or any other device that generates heat. For example, the device 100 may be an SMD which is a compact ultra-high definition (UHD) Internet Protocol (IP) client with far-field microphones, speakers and Digital Signal Processing (DSP) that enables the integration of voice assistants into a television (TV) experience. The device 100 can centralize voice-controlled services in a home by displaying visual feedback from a voice assistant on a TV and enabling voice control of video services. The device 100 may offer processing power, Vulkan® graphics and video decoding to deliver 4K UHD/High Dynamic Range content and OTT video services. In addition, the device 100 may offer dual-band Wi-Fi 6 to provide reliable video over wireless with flexibility in location. As shown in FIG. 1, the device 100 may house a multisided heat spreader 100, a printed circuit board (PCB) assembly 20, and a volumetric component 30. For example, the volumetric component 30 may be an auxiliary element such as a speaker box or a storage device such as a hard drive. The PCB 20 may include heat generation ICs. In some variations, the PCB 20 may provide Universal Serial Bus Type-C (USB-C) power delivery. The PCB 20 may be a Micro-Electro-Mechanical Systems (MEMS) PCB and/or a Main Control PCB. Other electronic components including a system on a chip (SoC), a power management integrated circuit (PMIC), low power double data rate random access memory (LPDDR4), an embedded Multi-Media Controller (eMMC), an Ethernet component, a front end module dual-flat no-leads package (FEM DFN), an amplifier, and a microphone may be provided with the PCB 20. As shown in FIG. 1, the PCB 20 may be stacked on the chassis 40B. The multisided heat spreader 10 may be stacked on the PCB 20. The volumetric component 30 may be stacked on the multisided heat spreader 10. The cover 40A may be stacked over the volumetric component 30. The cover 40A and the chassis 40B may mate (for example, via snap fasteners) so as to define an enclosure which houses the multisided heat spreader 10, the PCB 20, and the volumetric component 30.

Figure 2:
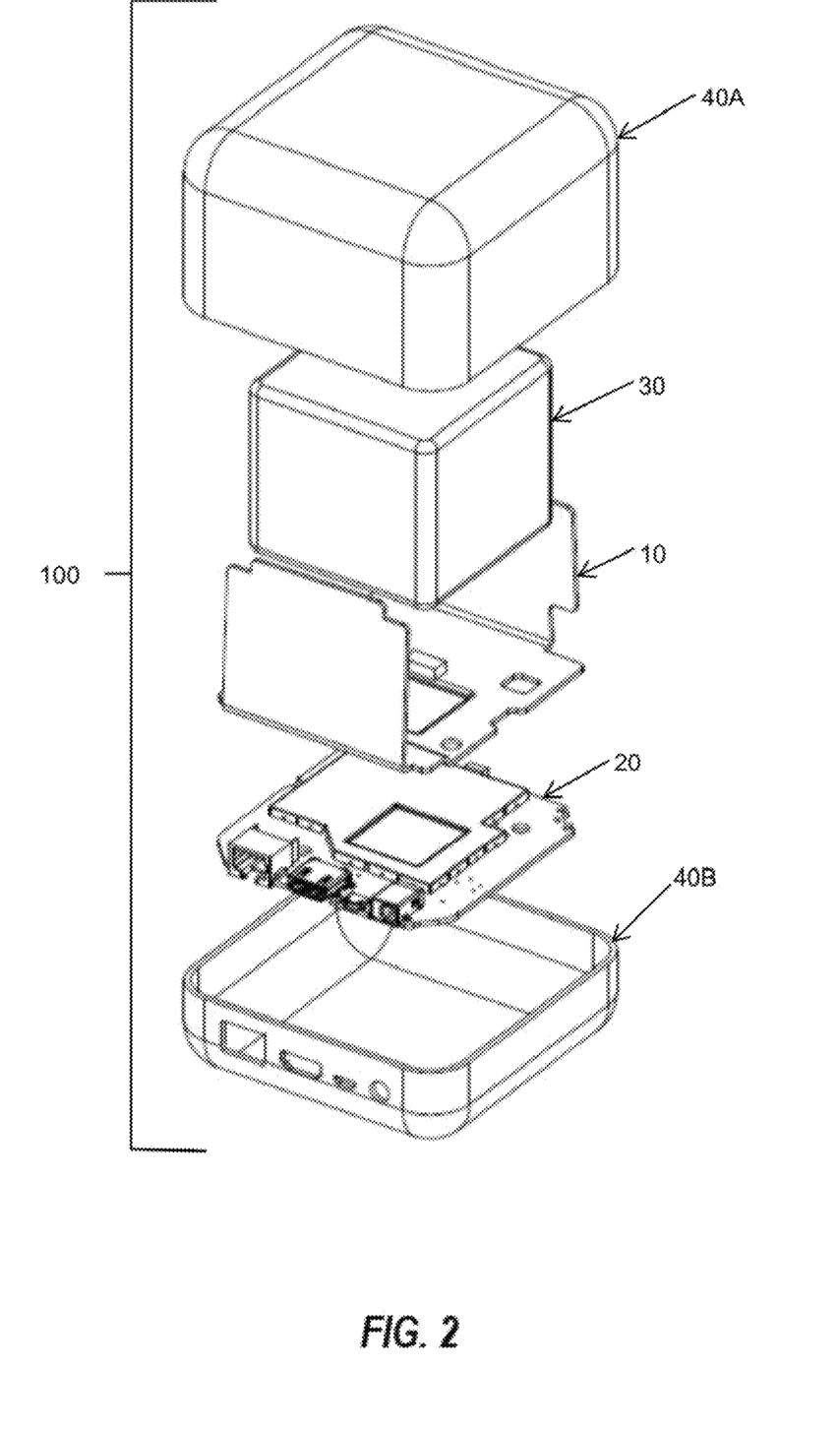
FIG. 2 shows an exploded rear perspective view of the example device according to the present disclosure.

FIG. 2 shows an exploded rear perspective view of the example device 100.

Figure 3:
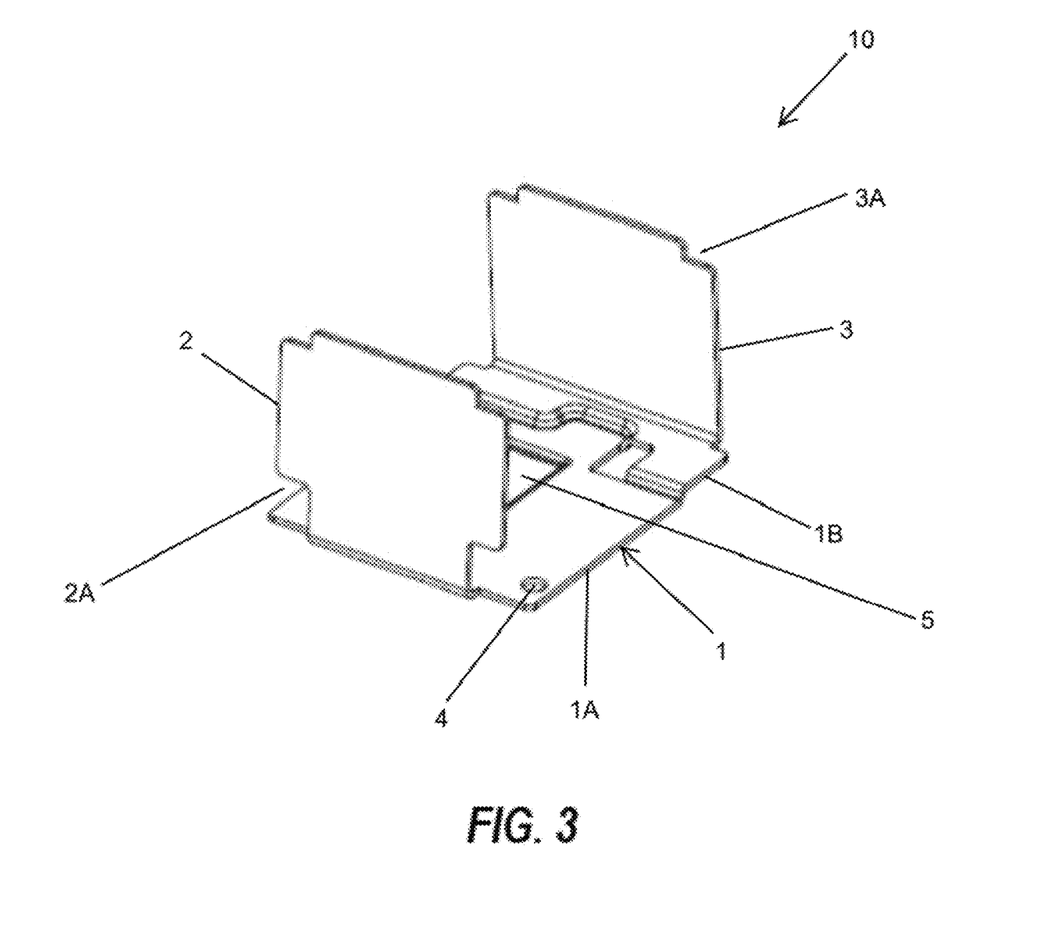
FIG. 3 is a front perspective view of a multisided heat spreader according to the present disclosure.

FIG. 3 shows a front perspective view of the multisided heat spreader 10. In an exemplary embodiment, the multisided heat 10 spreader comprises a base 1; a first wall 2; and a second wall 3. A proximal end of the first wall 2 is connected to a first end of the base 1. A proximal end of the second wall 3 is connected to a second end of the base 1. The first end of the base 1 is opposite to the second end of the base 1. A space is defined adjacent to a first surface (e.g., a top surface) of the base and between the first wall 2 and the second wall 3 such that the multisided heat spreader 1 is open between a distal end of the first wall 2 and a distal end of the second wall 3. The first wall 2 and the second wall 3 are configured to receive an electronic component (such as volumetric component 30) in the space therebetween. A second surface (e.g., a bottom surface) of the base 1 is configured to be attached to a heat generation component (such as PCB 20). The first surface of the base 1 is opposite to the second surface of the base 1.

The first wall 2 and the second wall 3 may be parallel to one another. The first wall 2 and the second wall 3 may be parallel to respective walls of the enclosure (i.e., the cover 40A and/or the chassis 40B). The first wall 2 and the second wall 3 may have different shapes. The first wall 2 may include a cutout 2A defined therein for facilitating attachment to the cover 40A and/or the chassis 40B by accommodating features such as snap fasteners. The second wall 3 may include a cutout 3A defined therein for facilitating attachment to the cover 40A and/or the chassis 40B by accommodating features such as snap fasteners. In some variations, the first wall 2 may include four cutouts 2A at respective corners thereof and the second wall 3 may include two cutouts 3A at distal corners thereof. The base 1 may include a first level 1A and a second level 1B higher than the first level 1A for accommodating components of the PCB 20 thereunder. In some variations, the base 1 may be flat. In some variations, the configuration of the walls 2, 3 together with the base 1 may define a U-shape, a C-shape, a partial trapezoid shape, or a partial parallelogram shape. In some variations, the first wall 2 and the second wall 3 may have the same shape.

At least one of the base 1, the first wall 2 or the second wall 3 may be formed of aluminum, copper, steel, brass, or another thermally conductive material. In some variations, the base 1, the first wall 2 and the second wall 3 are formed as a single piece.

The multisided heat spreader 10 may include one or more apertures 4 for receiving fasteners (not shown) to secure the multisided heat spreader 10 to the PCB 20. The multisided heat spreader 10 may include an accommodating portion 5 for a thermal pad 6 (see FIG. 5).

Heat is conducted by the base 1 of the multisided heat spreader 10 to the first wall 2 and the second wall 3. The heat is transferred via convection and radiation to the exterior through the enclosure. The shape of the multisided heat spreader 10 helps to dissipate the heat produced by the ICs to the walls of the enclosure thereby improving the thermal transfer required by the IC with more power consumption.

The multisided heat spreader 10 may provide a single component to be placed on an IC circuit and the walls 2, 3 extend to the upper side of the enclosure so as to promote the heat dissipation. The mounting of the multisided heat spreader 10 can be adapted to the supports provided by the enclosure or by the PCB locations. The supports will provide the proper contact between the multisided heat spreader 10 and the IC.

Figure 4:
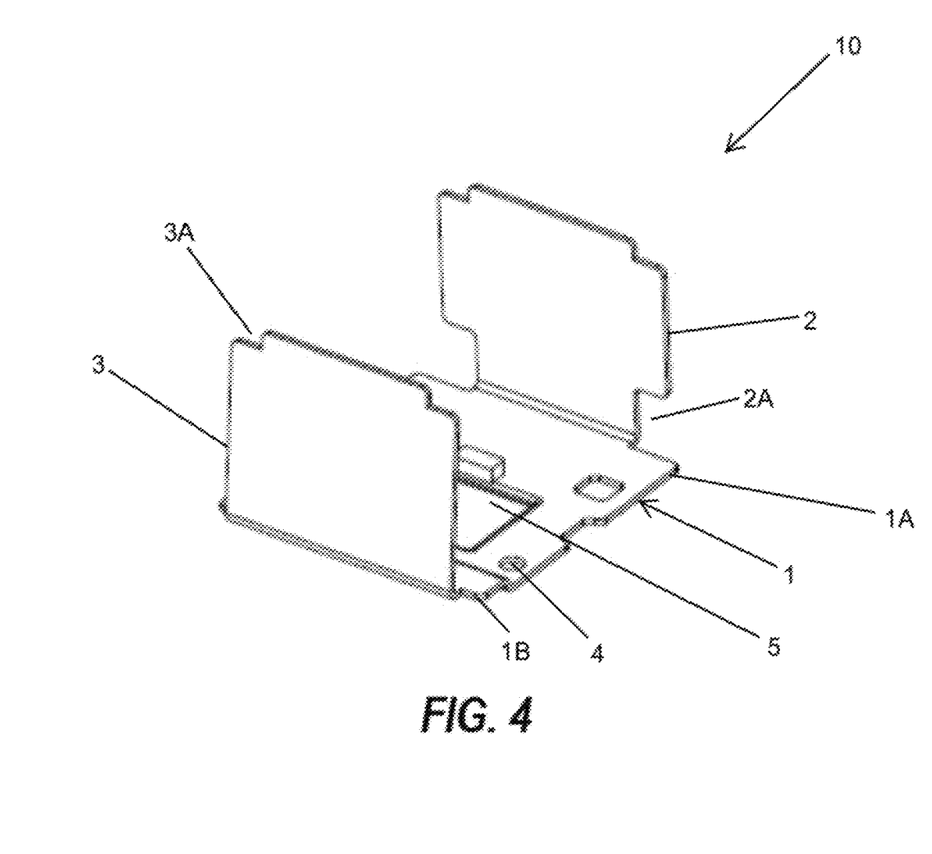
FIG. 4 is a rear perspective view of the multisided heat spreader according to the present disclosure.

FIG. 4 shows a rear perspective view of the multisided heat spreader 10.

Figure 5:
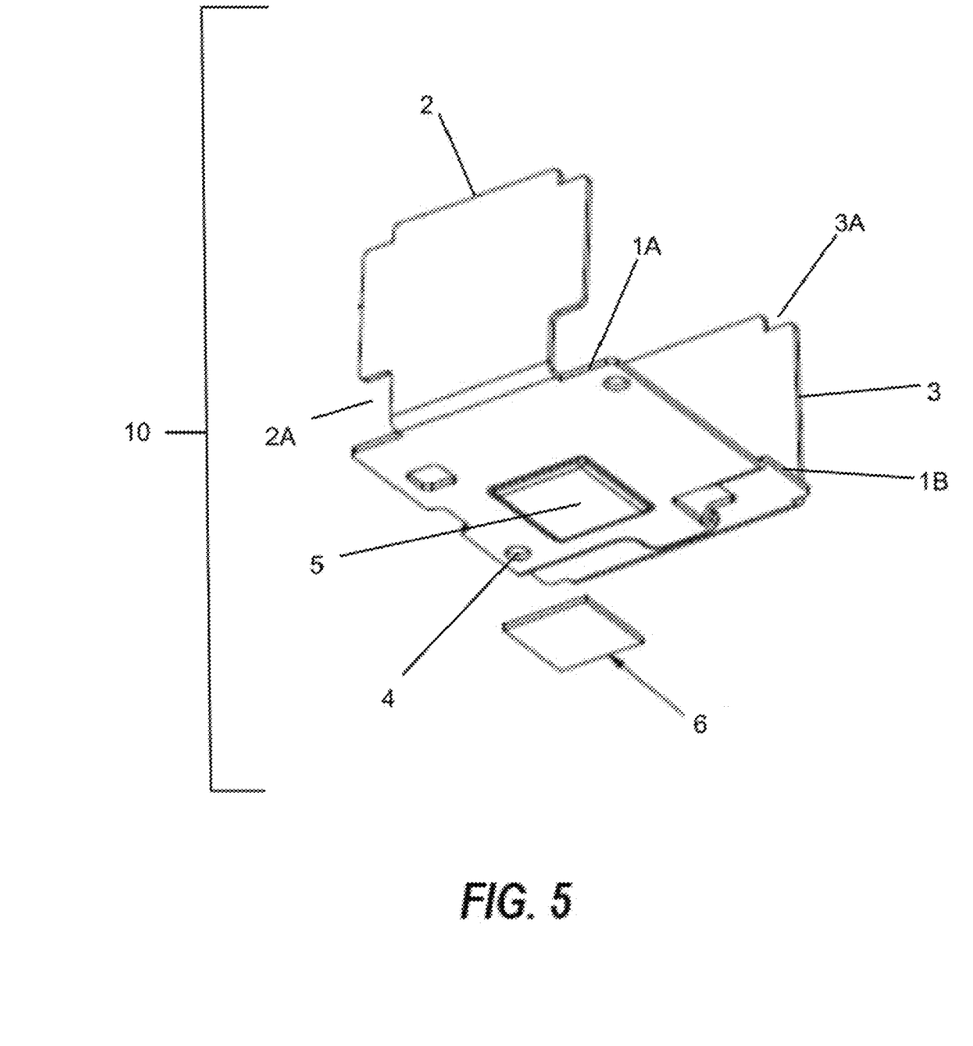
FIG. 5 is an exploded front perspective view of the multisided heat spreader and a thermal pad according to the present disclosure.

FIG. 5 is an exploded front perspective view of the multisided heat spreader 10 and a thermal pad 6. The thermal pad 6 may be thermally conductive and may function as a gap filler which provides an effective thermal interface between the heat spreader 10 and the PCB 20. In other words, the thermal pad 6 may be located in between the PCB 20 and one or more contact points of the multisided heat spreader 10. The thermal pad 6 may make contact on one side with the PCB 20 and may make contact on the other side with the multisided heat spreader 10. The multisided heat spreader 10 may facilitate a transfer of heat (e.g., through conduction cooling) from the bottom panel of the device 100 (e.g., the panel nearest to the PCB 20) toward the side panels of the device 100. The flow of air over the first wall 2 and the second wall 3 may facilitate a transfer of heat (e.g., through convection cooling) from the walls 2, 3 to the flow of air. Accordingly, the multisided heat spreader 10 may facilitate a transfer of heat from the bottom panel of the chassis 40B to the side panels of the cover 40A.

Figure 6:
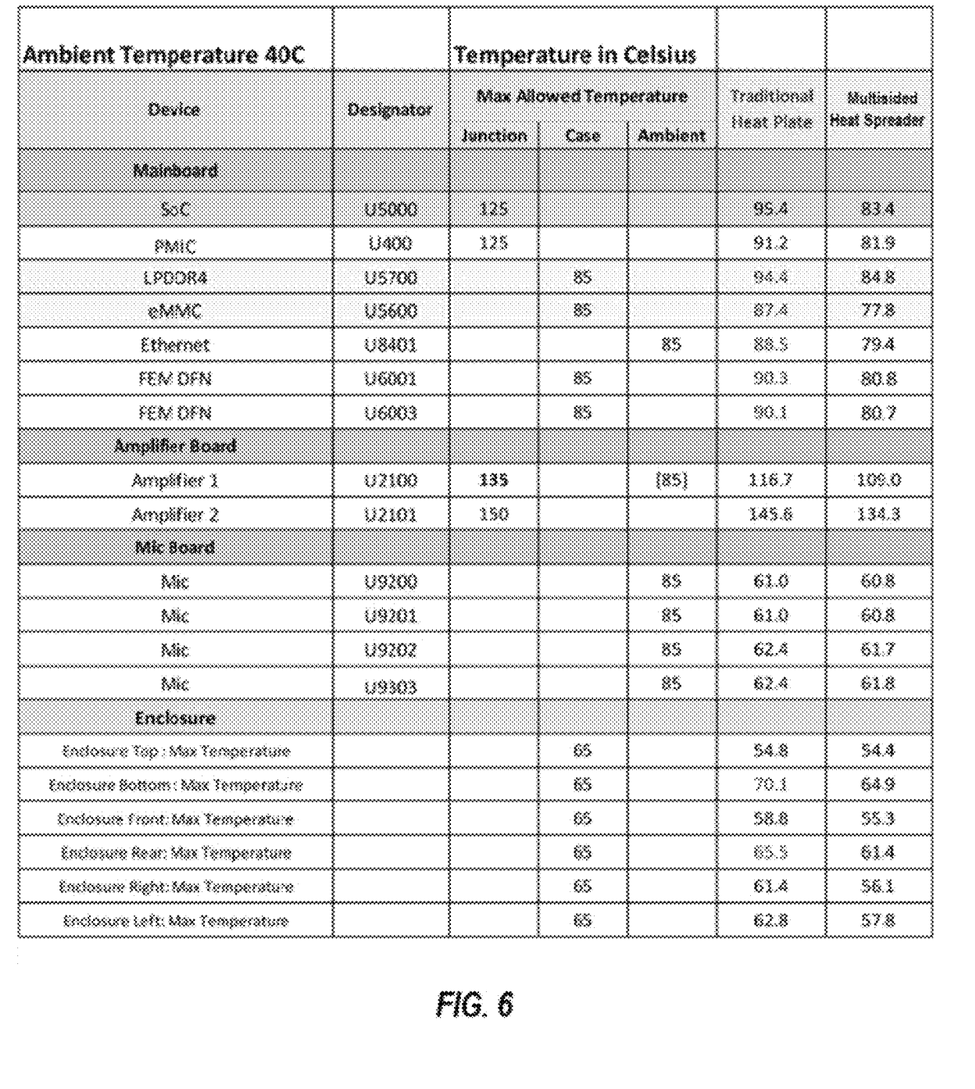
FIG. 6 shows a table of comparative thermal values of: (i) various electronic components and the enclosure of a device including a traditional heat plate; and (ii) various electronic components and the enclosure of a device including the multisided heat spreader according to the present disclosure.

FIG. 6 shows a table of comparative thermal values of: (i) various electronic components and the enclosure of a device including a traditional heat plate; and (ii) various electronic components and the enclosure of a device including the multisided heat spreader according to the present disclosure.

From the results, it is evident that the multisided heat spreader provides temperature improvements of about 12% for the components on the main board and about 7% for the components on the amplifier board. Also, the multisided heat spreader reduces temperatures so as to be under the operational range in order to have a reliable product. Finally, the multisided heat spreader eliminates hotspots on the housing surface so as to meet safety standards.

In all categories, the multisided heat spreader according to the present disclosure considerably improves thermal performance with respect to both the electronic components and the enclosure.

The subject matter of the present disclosure is provided as examples of devices, systems, methods, and programs for performing the features described in the present disclosure. However, further features or variations are contemplated in addition to the features described above. It is contemplated that the implementation of the components and functions of the present disclosure can be done with any newly arising technology that may replace any of the above implemented technologies.

Additionally, the above description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

In view of the above, the multisided heat spreader and device disclosed herein solve the problems of existing solutions and provide an efficient and cost effective solution to disperse heat away from both higher-temperature components and lower-temperature components of a circuit board using multiple heat transfer methods.

We claim:

1. A device comprising:
   a multisided heat spreader;
   a heat generation component; and
   an electronic component,
   wherein:
   the multisided heat spreader includes a base, a first wall and a second wall;
   a proximal end of the first wall is connected to a first end of the base;
   a proximal end of the second wall is connected to a second end of the base;
   the first end of the base is opposite to the second end of the base;
   a space is defined adjacent to a first surface of the base and between the first wall and the second wall such that the multisided heat spreader is open between a distal end of the first wall and a distal end of the second wall;
   the first wall and the second wall are configured to receive the electronic component in the space therebetween;
   a second surface of the base is configured to be attached to the heat generation component; and
   the first surface of the base is opposite to the second surface of the base.

2. The device of claim 1, wherein the heat generation component is a printed circuit board (PCB).

3. The device of claim 1, wherein the electronic component is a speaker box.

4. The device of claim 1, wherein the first wall and the second wall have different shapes.

5. The device of claim 1, wherein the base includes a first level and a second level higher than the first level.

6. The device of claim 1, wherein at least one of the first wall or the second wall has a cutout defined therein.

7. The device of claim 1, wherein the first wall is parallel to the second wall.

8. The device of claim 1, wherein the base, the first wall and the second wall are formed as a single piece.

9. The device of claim 1, wherein at least one of the base, the first wall or the second wall is formed of aluminum, copper, steel or brass.

10. The device of claim 1, further comprising:
    an enclosure;
    wherein the first wall of the multisided heat spreader and the second wall of the multisided heat spreader are parallel to respective walls of the enclosure.

11. The device of claim 1, further comprising a thermal pad between the base and the heat generation component.

12. A multisided heat spreader comprising:
    a base;
    a first wall; and
    a second wall, wherein:
a proximal end of the first wall is connected to a first end of the base;
a proximal end of the second wall is connected to a second end of the base;
the first end of the base is opposite to the second end of the base;
a space is defined adjacent to a first surface of the base and between the first wall and the second wall such that the multisided heat spreader is open between a distal end of the first wall and a distal end of the second wall;
the first wall and the second wall are configured to receive an electronic component in the space therebetween;
a second surface of the base is configured to be attached to a heat generation component; and
the first surface of the base is opposite to the second surface of the base.

13. The multisided heat spreader of claim 12, wherein the heat generation component is a printed circuit board (PCB).

14. The multisided heat spreader of claim 12, wherein the electronic component is a speaker box.

15. The multisided heat spreader of claim 12, wherein the first wall and the second wall have different shapes.

16. The multisided heat spreader of claim 12, wherein the base includes a first level and a second level higher than the first level.

17. The multisided heat spreader of claim 12, wherein at least one of the first wall or the second wall has a cutout defined therein.

18. The multisided heat spreader of claim 12, wherein the first wall is parallel to the second wall.

19. The multisided heat spreader of claim 12, wherein the base, the first wall and the second wall are formed as a single piece.

20. The multisided heat spreader of claim 12, wherein at least one of the base, the first wall or the second wall is formed of aluminum, copper, steel or brass.

* * * * *